United States Patent [19]
Laws

[11] Patent Number: 5,303,417
[45] Date of Patent: Apr. 12, 1994

[54] MIXER FOR DIRECT CONVERSION RECEIVER

[75] Inventor: Peter G. Laws, Swindon, England

[73] Assignee: Plessey Semiconductors Ltd., England

[21] Appl. No.: 740,992

[22] Filed: Aug. 6, 1991

[30] Foreign Application Priority Data

Aug. 8, 1990 [GB] United Kingdom ............... 9017418

[51] Int. Cl.$^5$ ............................................. H04B 1/28
[52] U.S. Cl. ................................ 455/314; 455/324; 455/333; 307/529
[58] Field of Search .......................... 455/84, 76, 86, 87, 455/324, 333, 226.1, 314; 307/529; 330/151; 331/12; 370/120

[56] References Cited

U.S. PATENT DOCUMENTS

| | | | |
|---|---|---|---|
| 4,032,857 | 6/1977 | Lum | 330/151 |
| 4,394,626 | 7/1983 | Kurihara | 331/12 |
| 4,584,710 | 4/1986 | Hansen | 455/226.1 |
| 4,768,187 | 8/1988 | Marshall | 370/120 |

FOREIGN PATENT DOCUMENTS

3734882 3/1989 Fed. Rep. of Germany ...... 455/314

Primary Examiner—Reinhard J. Eisenzopf
Assistant Examiner—Mark D. Wisler
Attorney, Agent, or Firm—Kirschstein, Ottinger, Israel & Schiffmiller

[57] ABSTRACT

A mixer system for a direct conversion receiver, the receiver including an RF input path which is divided into I and Q paths for demodulating from the RF signals I and Q signals in phase quadrature with one another, the mixer system including first and second serially coupled mixer means in the I path, third and fourth serially coupled mixer means in the Q path, and a local oscillator providing a plurality of local oscillator signals in phase quadrature with one another to the mixer means, such that the first mixer means receives a local oscillator signal in phase quadrature to the local oscillator signal applied to the second mixer means, and the third mixer means receives a local oscillator in phase quadrature to that applied to the fourth mixer means.

7 Claims, 12 Drawing Sheets

Fig.1. PRIOR ART SYSTEM

Fig. 2.
PRIOR ART DIRECT CONVERSION SYSTEM

Fig.3.
HALF FREQUENCY MIXER
PRIOR ART

PHASE SHIFT CIRCUITS

PHASE SHIFT CIRCUIT B

INPUT AND OUTPUTS TO BE TERMINATED IN CHARACTERISTIC IMPEDANCE R.

PHASE SHIFT CIRCUIT A

MIXER FOR DIRECT CONVERSION RECEIVER

FIELD OF THE INVENTION

This invention relates to a mixer arrangement for maximising efficiency whilst minimising signal distortion and noise, and is intended for use in direction conversion of a received radio signal to quadrature I & Q baseband signals using a tuned local oscillator.

BACKGROUND ART

Figure 1:
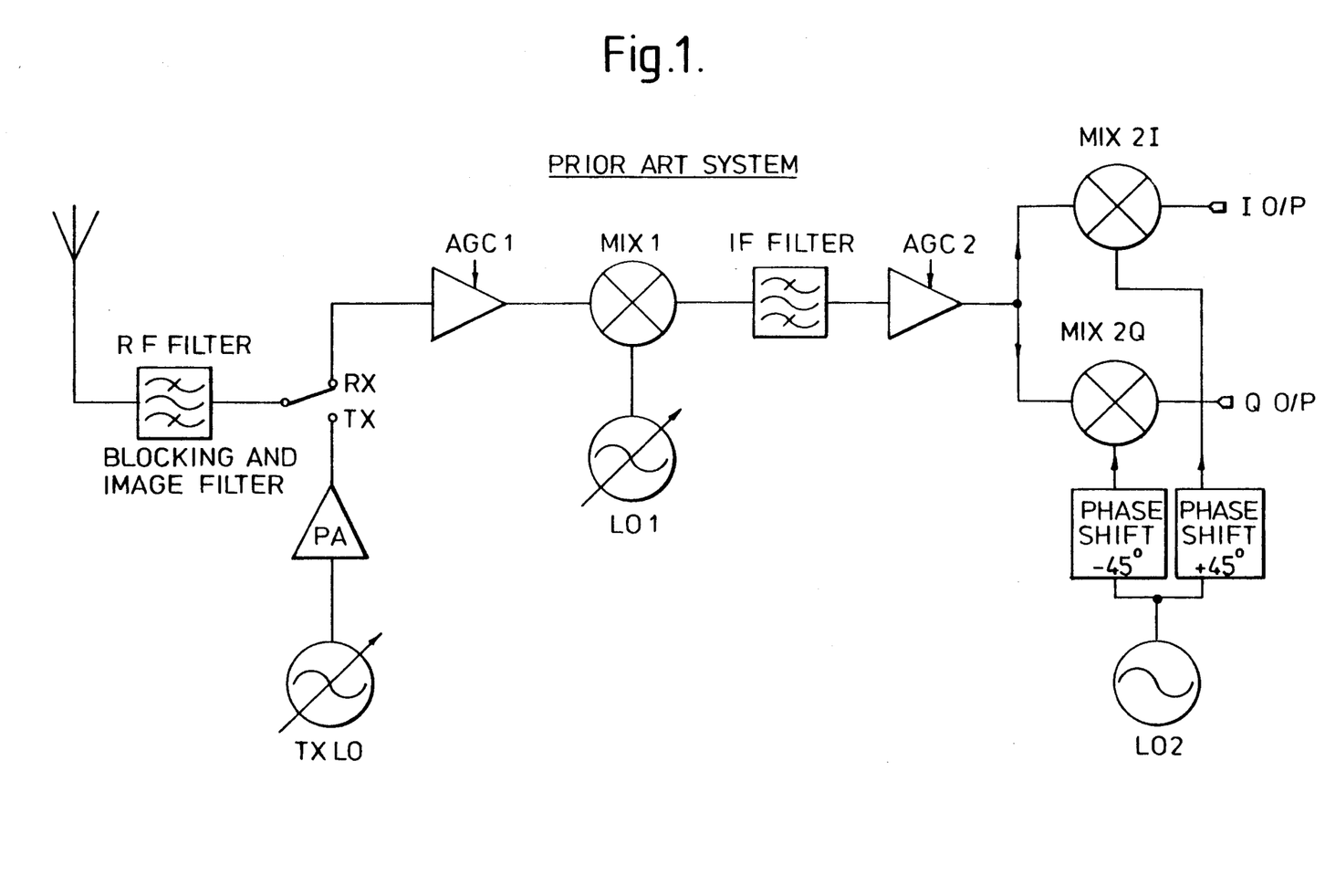
FIGS. 1 to 4 are diagrams of known transceivers/receivers.

The superheterodyne is the most commonly used radio receiver system. As shown in FIG. 1, it can be seen that two local oscillators are required for receiving and a third LO signal is needed for transmitting in a transceiver system. The first LO will probably be generated by a VCO controlled by a synthesiser whilst the TX LO may be generated using a second frequency synthesiser or be produced by mixing the first and second LO signals. An RF filter is required to block unwanted radio signals and remove image frequencies which would otherwise be converted by the first mixer to an inband IF frequency. A second high frequency filter is required to remove unwanted side tones generated by the nonlinear action of the first mixer.

Figure 2:
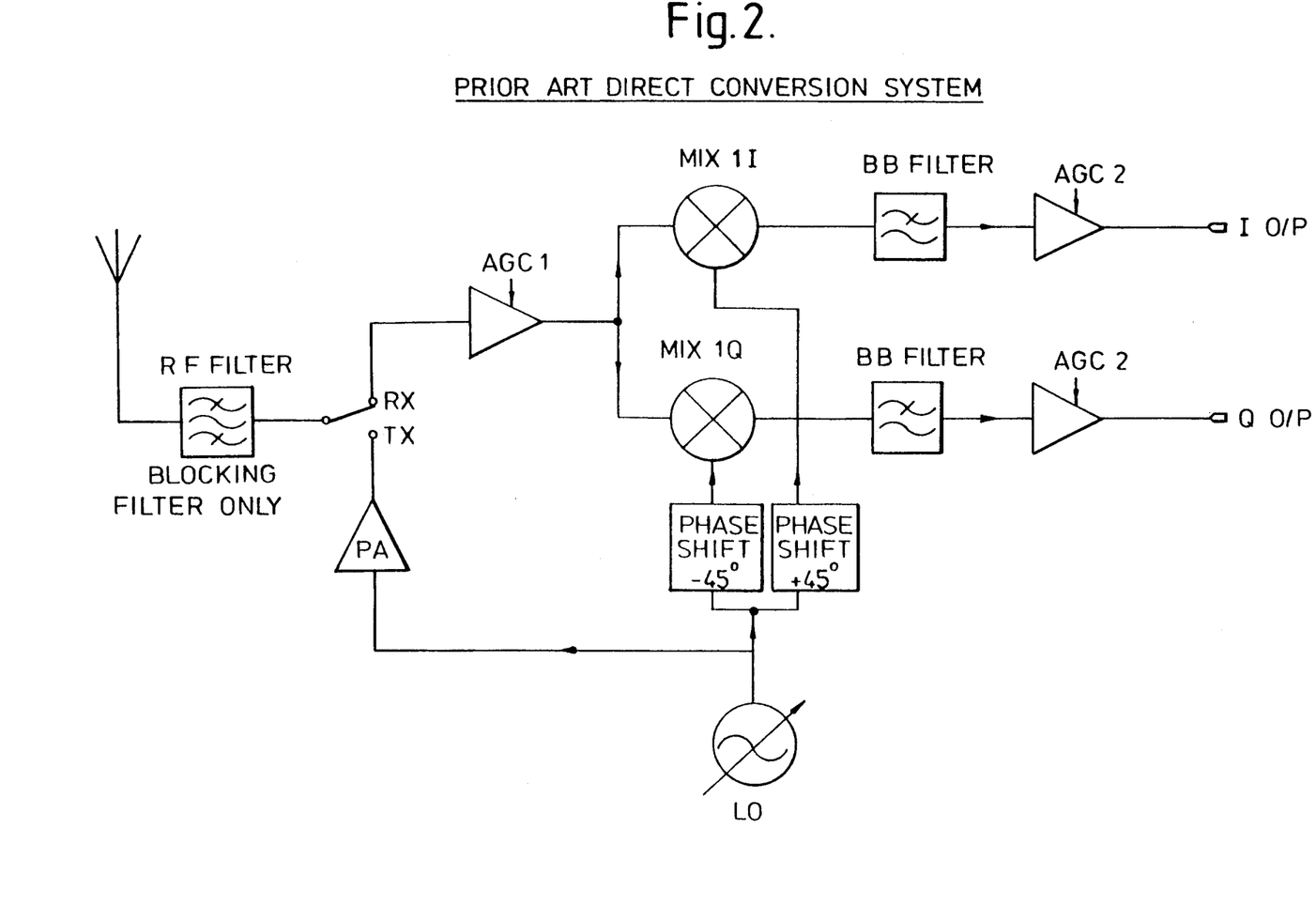

Direct conversion can be obtained by a homodyne system as shown in FIG. 2. This system is simplified by the need for only one LO signal which may also be directly used for tansmitting in a transceiver. Filtering is also easier to perform since the RF filter has only to provide a blocking function and all post mixer filtering is provided by low pass baseband filters. The advantage of these base band filters is that they may be totally constructed within an integrated circuit. Automatic gain control will be required which can be provided by an RF AGC 1 stage or a combined action of AGC 1 and base band AGC 2 stages as shown.

The disadvantage with this direct conversion system is that the local oscillator may radiate a signal which when picked up at the front end will be converted down and generate a DC offset in the mixer outputs. Since this signal may be a multipath reflected signal when received, it will probably have a varying amplitude and phase and hence when converted down could produce varying offsets i.e. unwanted base band signals. This problem is reduced by minimising the generated LO signal level, however this can result in decreased gain and noise performance in the mixers.

Half-frequency direct conversion systems as disclosed in Swiss Patent CH-A-671856

Figure 3:
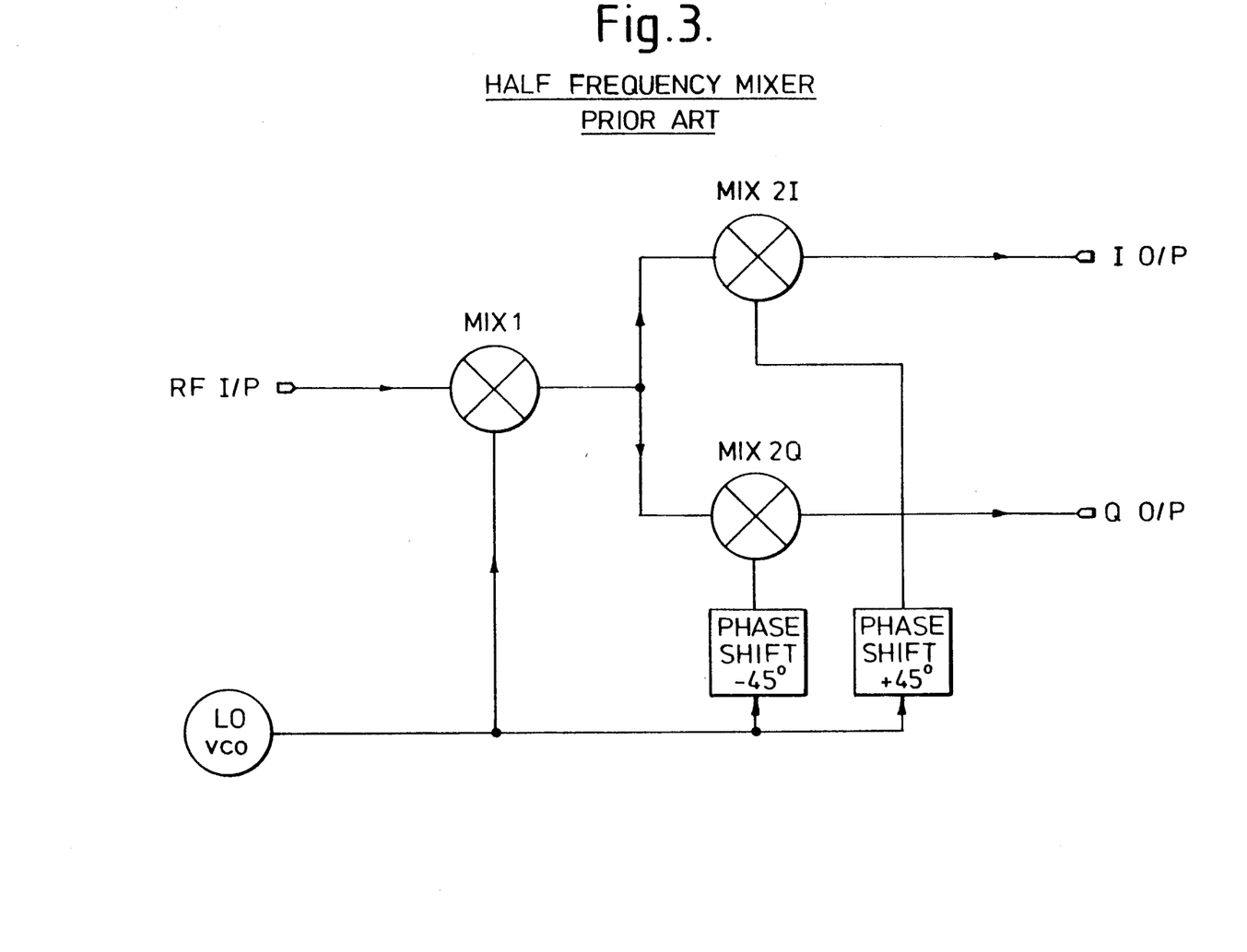

The basic concept of the half frequency conversion technique is shown in FIG. 3. In essence the received radio signal is mixed down to baseband by two directly coupled mixers each being driven by an LO at half the wanted RF frequency. I and Q baseband signals can be derived by providing quadrature LO drives to the second mixer stages. Note that no intermediate filtering is required (between the first and second mixers) since the sidebands generated by the first mixer do not interfere when converted by the second mixing stage with the baseband outputs.

Figure 4:
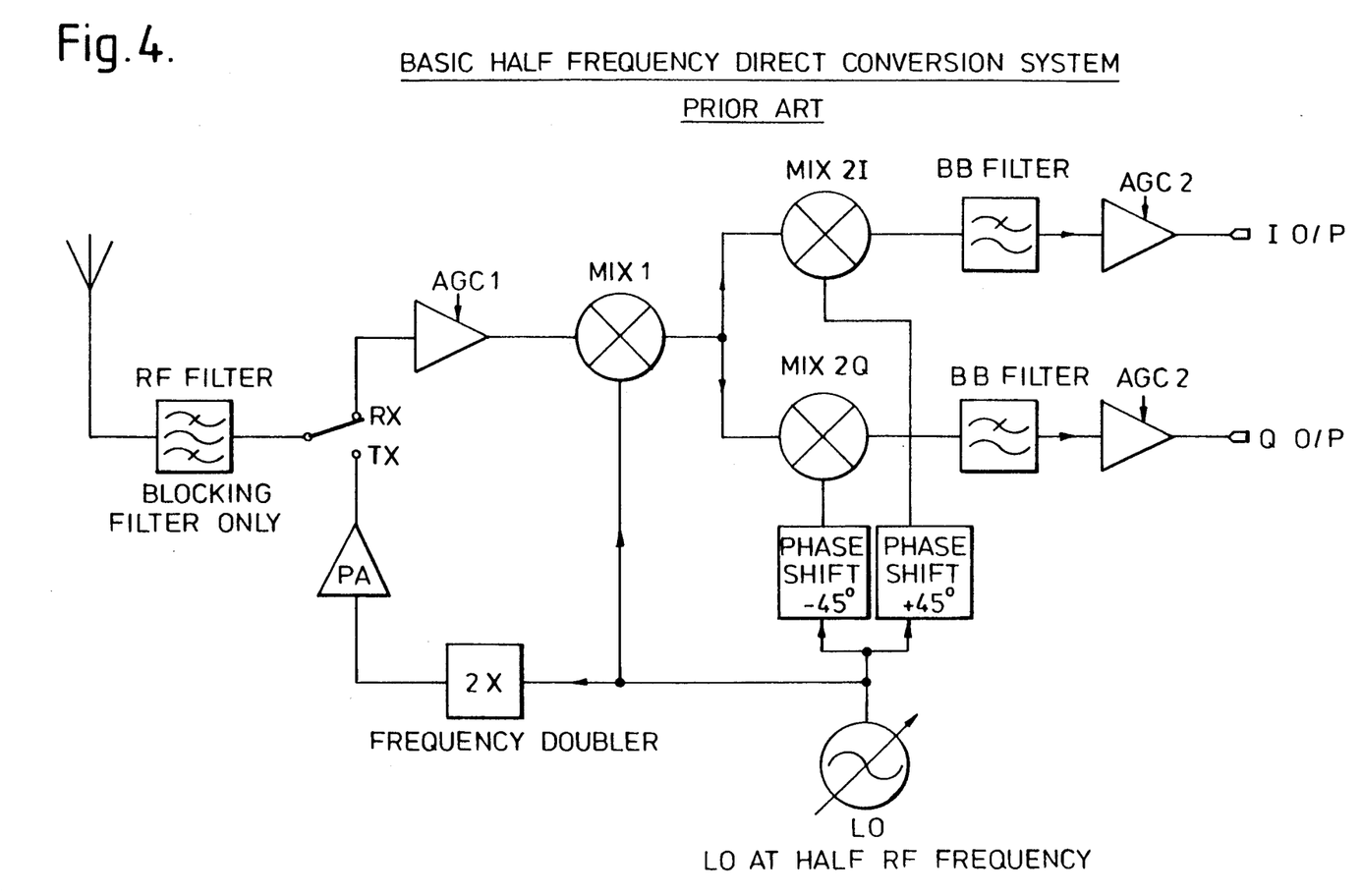

FIG. 4 shows how the half frequency conversion technique may be implemented in a transceiver system. The filtering and AGC requirements are similar to the basic (single mixer) homodyne system. For a transceiver the transmit frequency may be derived by doubling the LO signal as shown.

In implementing the system with serially coupled mixers it will be realised that additional noise and distortion will be generated by the need for the second mixer. Also there is also an inherent signal power loss (about 4dB) due to the power split into sidebands with only the baseband signal being of use. Most of the noise and distortion is generated in the tail of the mixer that converts an input voltage into a current, which is then subsequently commutated by the LO switching devices.

SUMMARY OF THE INVENTION

It is an object of the present invention to reduce the problems of noise and distortion associated with serially coupled mixers.

The present invention provides a mixer system for a direct conversion receiver, the receiver including an RF input path which is divided into I and Q paths for demodulating from the RF signals I and Q signals in phase quadrature with one another, the mixer system including first and second serially coupled mixer means in the I path, third and fourth serially coupled mixer means in the Q path, and a local oscillator providing a plurality of local oscillator signals in phase quadrature with one another to the mixer means, such that the first mixer means receives a local oscillator signal in phase quadrature to the local oscillator signal applied to the second mixer means, and the third mixer means receives a local oscillator in phase quadrature to that applied to the fourth mixer means.

In one arrangement, four local oscillator signals may be provided each to a respective mixer means and having relative phase shifts of for example +22.5, +67.5, −67.5, −22.5 degrees.

In a preferred arrangement said I and Q input paths have a quadrature phase shifting arrangement prior to said mixing means so that the I and Q signals are in phase quadrature prior to said mixing means. The local oscillator provides first and second signals in phase quadrature, and the first signal is applied to the first and third mixing means whereas the second signal is applied to the second and fourth mixing means. Such an arrangement has the advantage of simplicity of implementation.

In a preferred arrangement, the first and second mixer means are combined in a double balanced mixer arrangement as are the third and fourth mixer means. Thus the first mixer means comprises a first transistor means having its main current path connected in series with the main current path of a second transistor means forming said second transistor means. Appropriate local oscillator signals are applied to the control electrodes of the first and second transistor means. The RF input signal is injected into the main current path by further transistor means.

The overall configuration may be regarded as a stacked mixer arrangement in that the further transistor means and the first transistor means constitute a first mixer, and the further transistor means and the second transistor means constitute a second mixer.

Thus the abovementioned drawbacks can be greatly reduced by using stacked (cascaded) mixers such that the differential output currents from the first mixing stage are fed directly into the second mixer commutating devices. Hence in practice this takes the form of a double balanced mixer. A consequence of directly coupling the mixers in this way means that separate first stage mixers are required for I and Q branches.

From closer inspection of the double balanced mixer arrangement it can be shown that optimum commutation of the RF input will result when the LO inputs are in quadrature phase. Indeed in this case the combined commutation is the same as that of a single mixer with an LO input at the RF frequency as in the basic direct conversion system! From this it may be reasoned that the overall mixing efficiency is not reduced and that the only increase in noise would be due to the second mixer commutating devices. However, since the half frequency LO does not cause any pick up problems its amplitude may be increased enabling the effective mixer gain to increase with less noise contribution from all the mixer commutating devices. Note that attention should be paid to minimising the second harmonic of the LO as this will be at the wanted RF frequency.

BRIEF DESCRIPTION OF THE DRAWINGS

Preferred embodiments of the invention will now be described with reference to the accompanying drawings, wherein.

DISCLOSURE OF THE PREFERRED EMBODIMENTS

Figure 5:
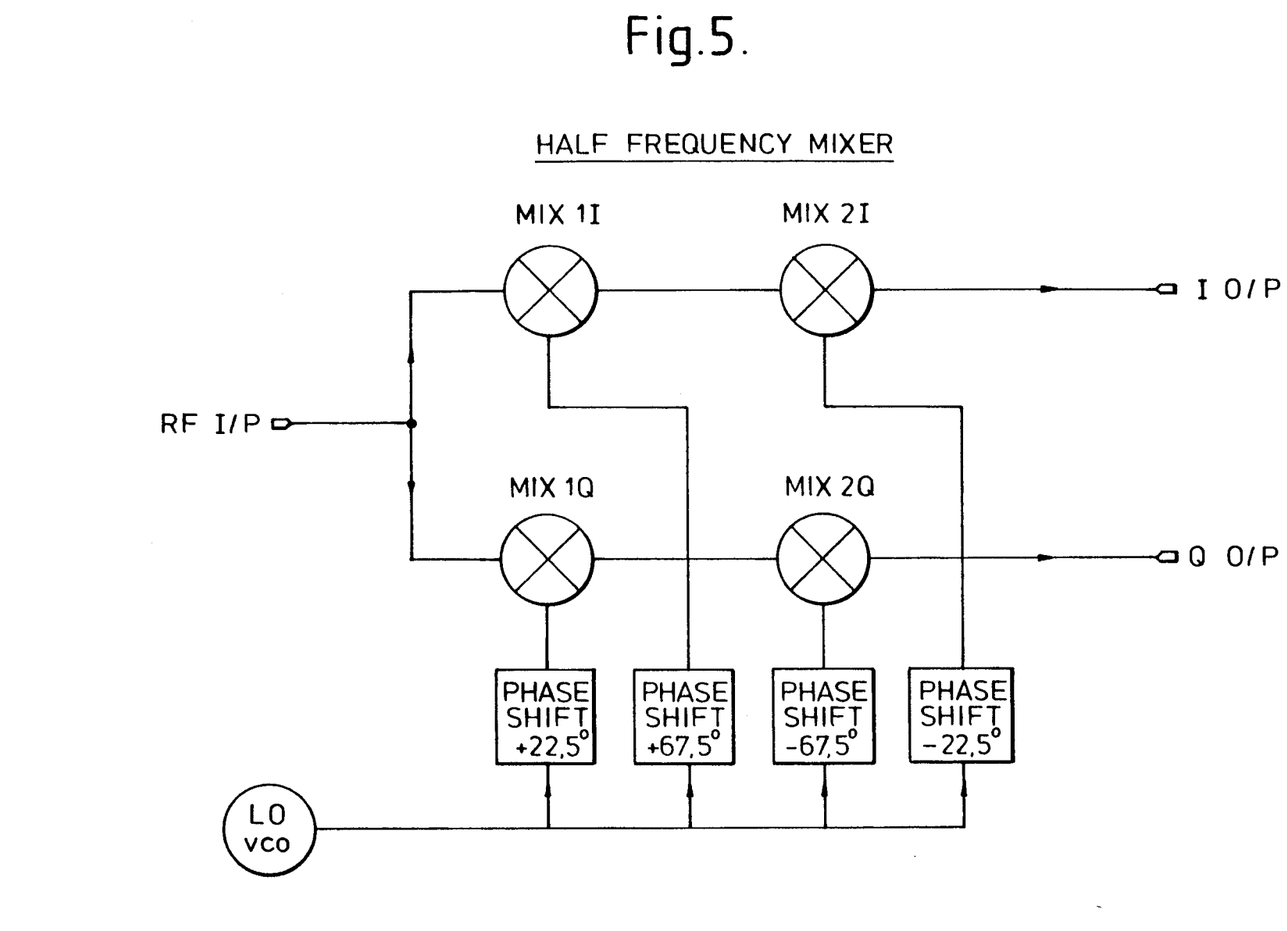
FIG. 5 is a block diagram of a first embodiment of the invention.

Referring now to the FIGS. 5 to 12 of the drawings, using two pairs of stacked mixers I and Q baseband signals may be derived as shown in FIG. 5. It is now evident that four phases of the LO signal are now required such that quadrature phases are provided between first and second mixer stages and that overall I and Q outputs are generated from the RF input. Generating these four phases from a true half frequency LO may be cumbersome and inefficient due to the range of phase angles required. If however an LO running at twice the RF frequency is used, the four half frequency phases may be generated using a divider network.

Figure 6:
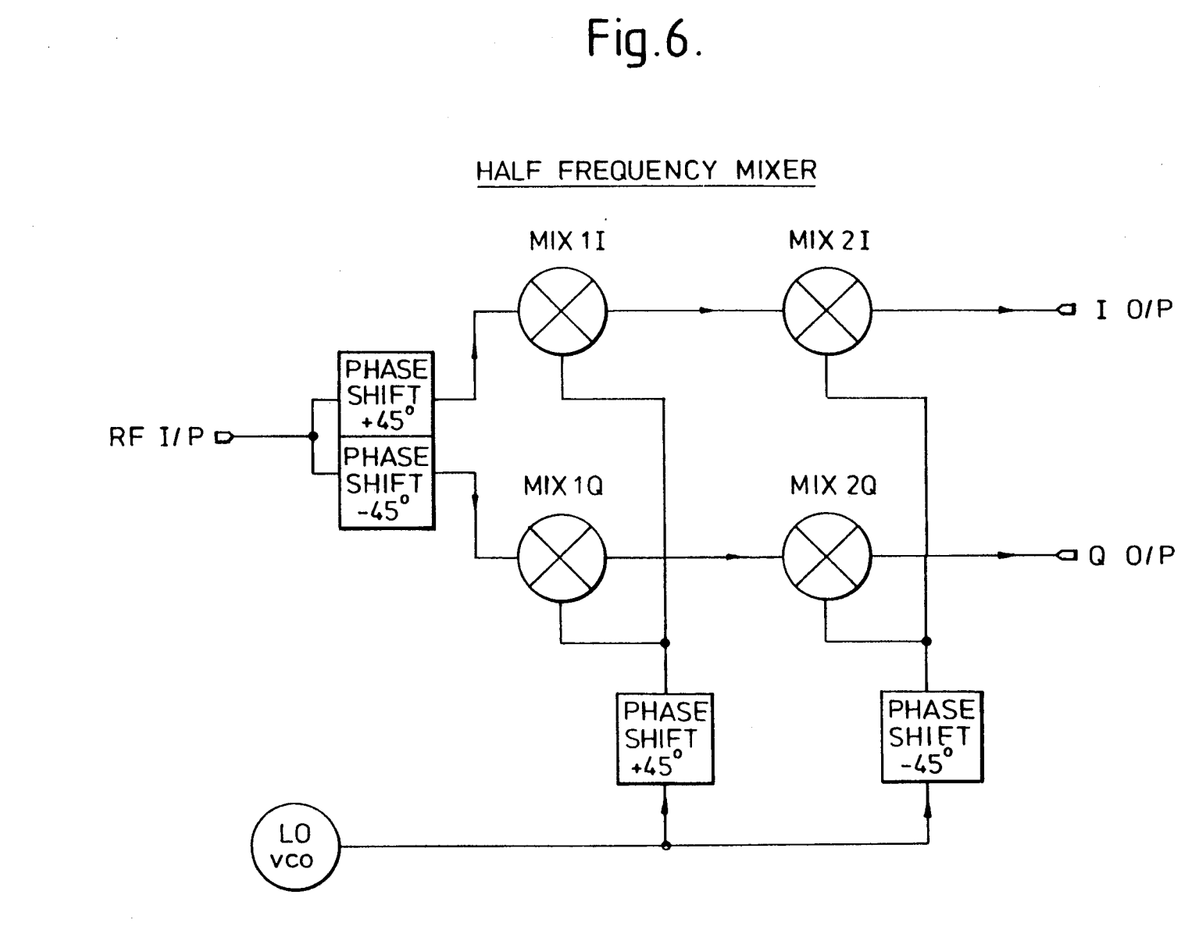
FIG. 6 is a block diagram of a second embodiment of the invention.
Figure 7:
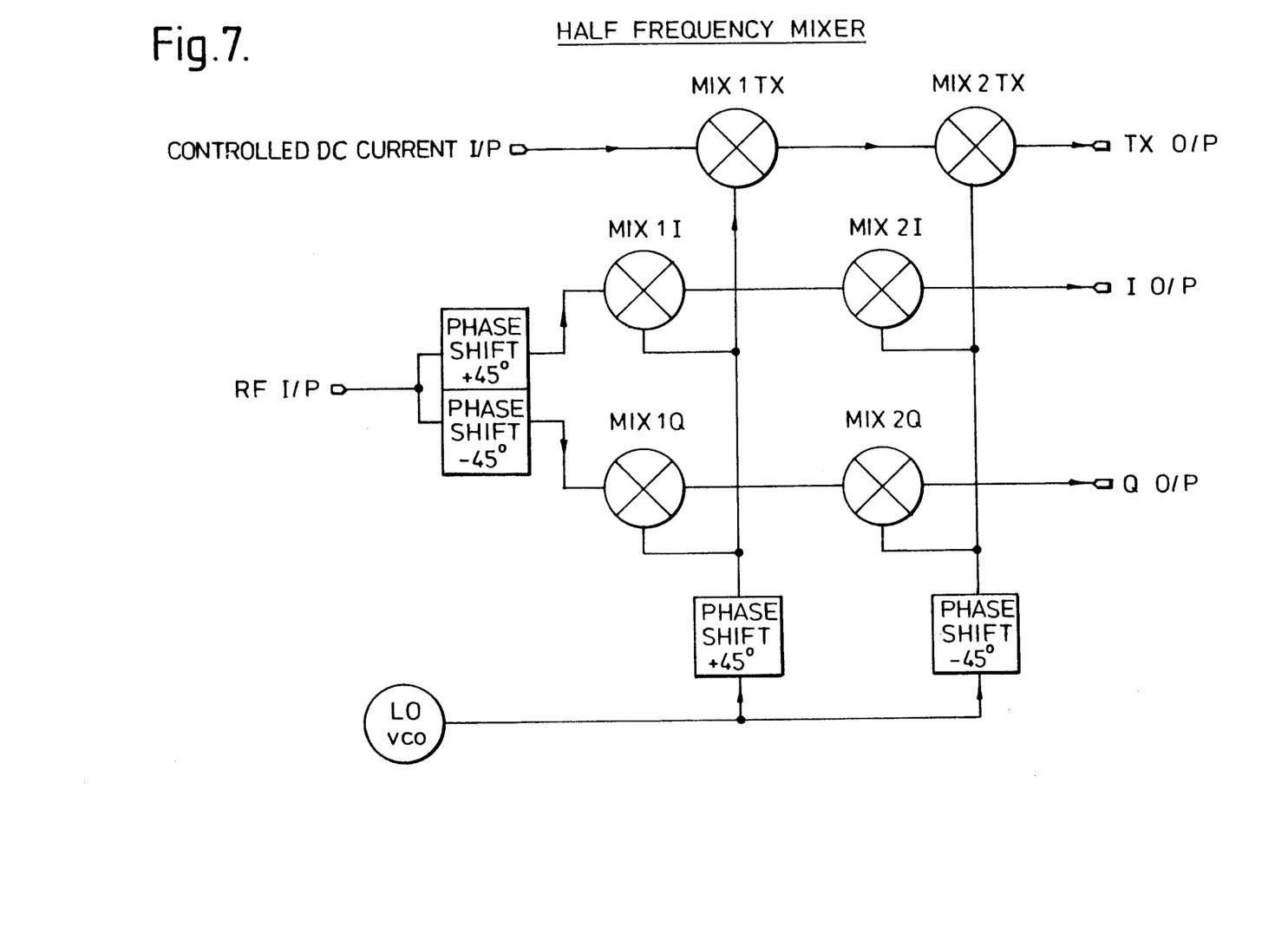
FIG. 7 is a diagram of the second embodiment of FIG. 6 adapted to form a transceiver.

An alternative approach is shown in FIG. 6. Here the I and Q outputs are determined by the phase shifted RF inputs. Since the LO drives are common to the mixer stages good matching between the two channels will automatically result. The phase difference between the two LO drives is not critical as this should only have a marginal effect on the mixing efficiency and create a constant DC shift on the outputs. This shift is due to the stacked mixers acting as a phase comparator between the two LO inputs. An additional advantage is that a transmit frequency may be generated using a further stacked mixer as shown in FIG. 7, utilising the same two LO inputs.

Figure 8:
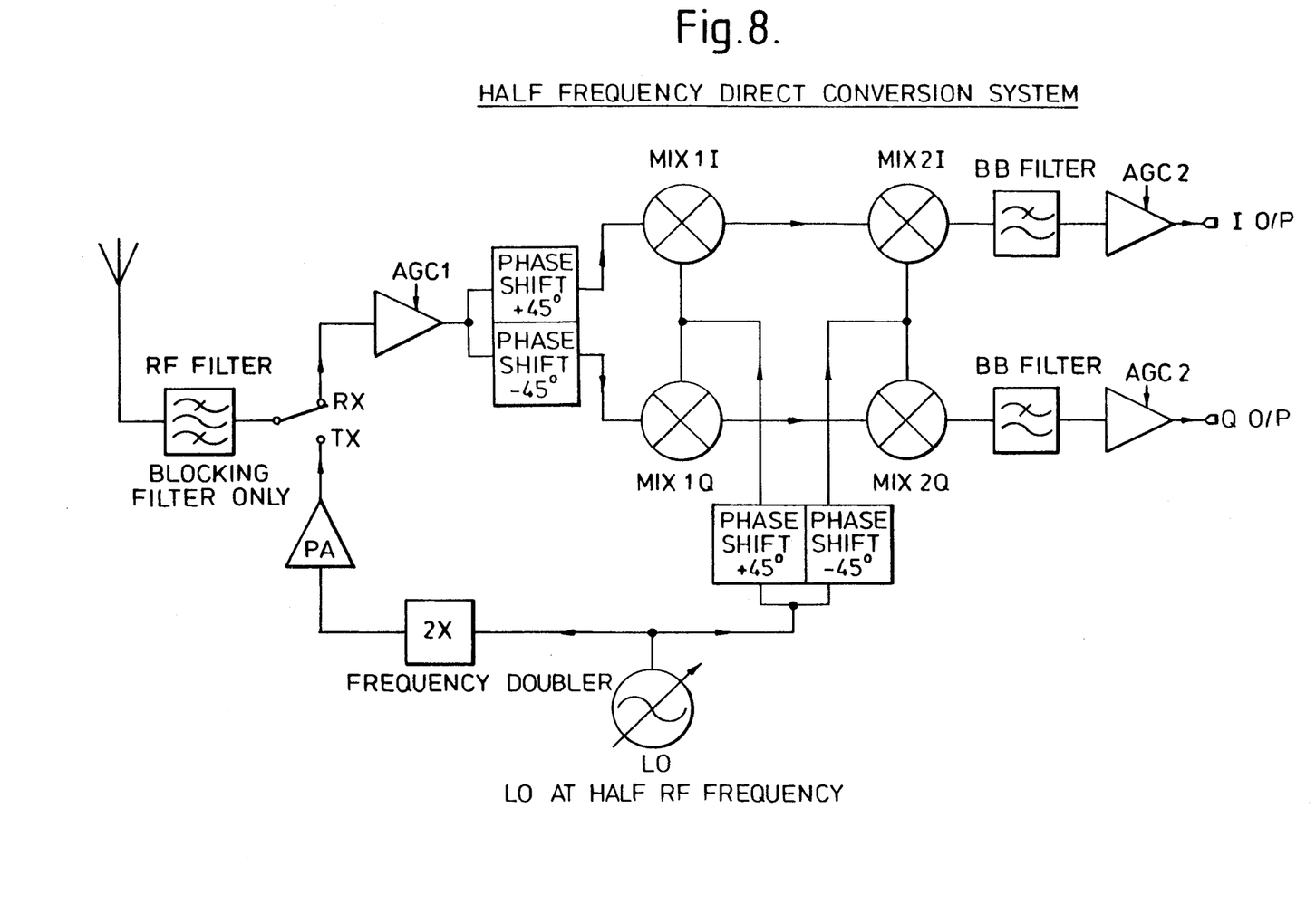
FIG. 8 is a diagram of the arrangement of FIG. 7 incorporated in a direct conversion transceiver.
Figure 9:
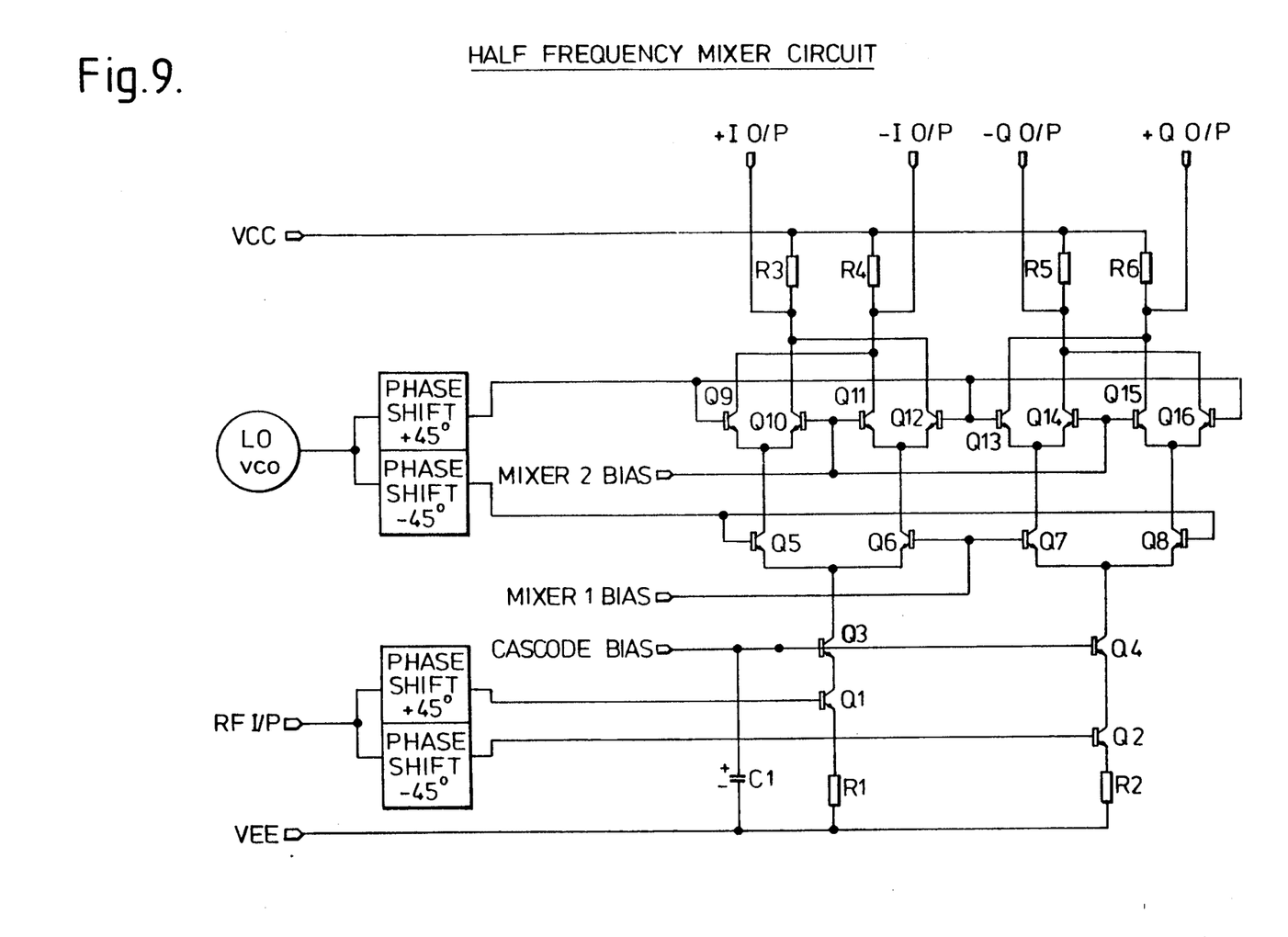
FIG. 9 is a detailed circuit diagram of the second embodiment of FIG. 6.

FIG. 8 shows a possible architecture for a half frequency direct conversion transceiver system. The half frequency receiver mixers may be implemented using bipolar transistors as shown in FIG. 9. Quadrature RF input signals are feed into Q1 R1 and Q2 R2 which generate the tail currents for the two stacked mixers. The I channel is made up from Q5 and Q6 forming the first mixer stage with Q9-Q12 forming the second stage. A differential output stage is shown with R3 and R4 converting the mixer output currents into voltages. A cascade stage consisting of Q3 has been included to help reduce any LO induced signals being feed through to the RF input. The Q channel is constructed in a similar fashion.

Figure 10:
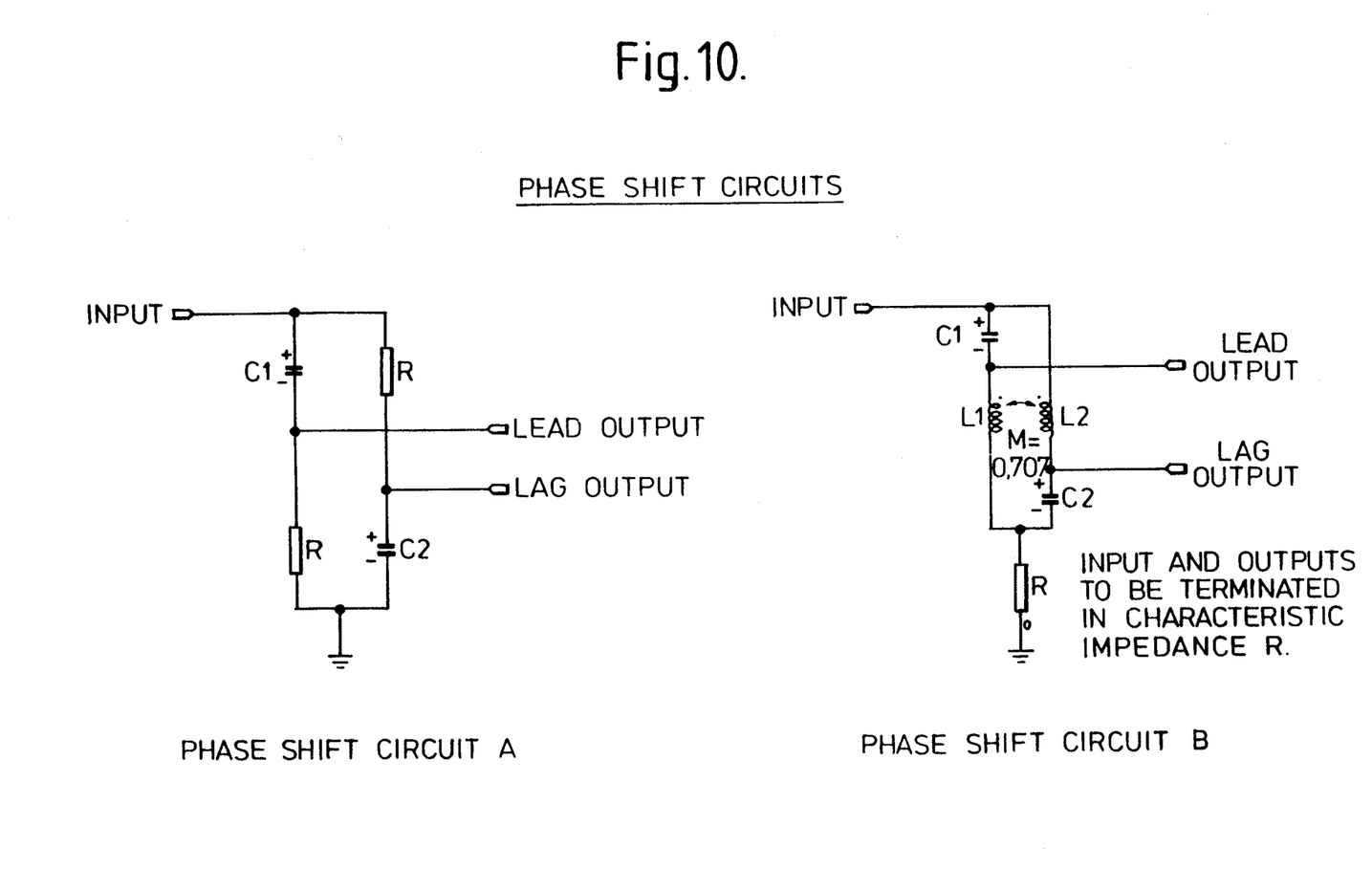
FIG. 10 shows circuit diagrams of phase shift arrangements for use with FIG. 6.
Figure 11:
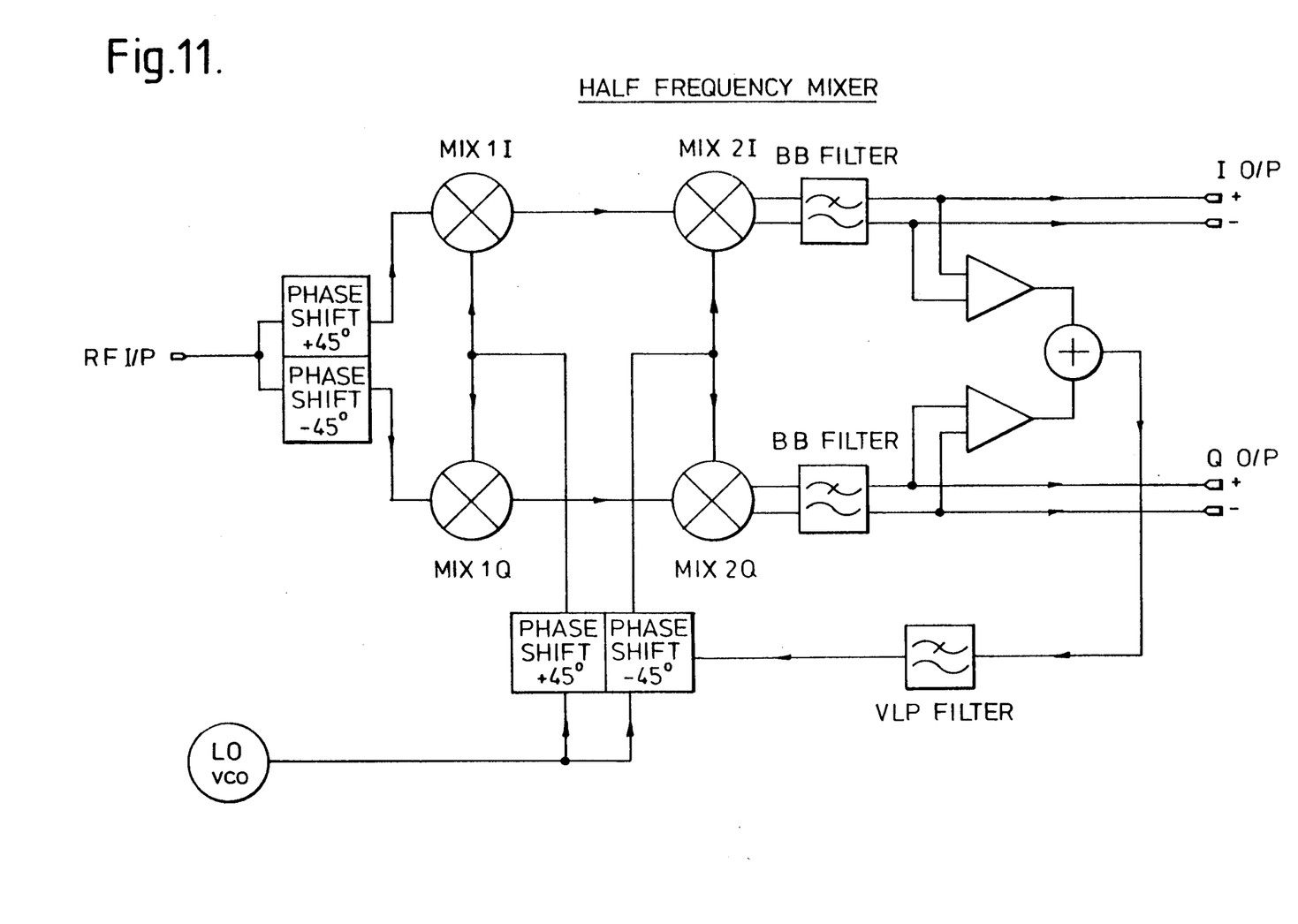
FIGS. 11 and 12 show respective direct conversion receivers incorporating the arrangement of FIG. 6 with adaptive control of the phase shift arrangement.
Figure 12:
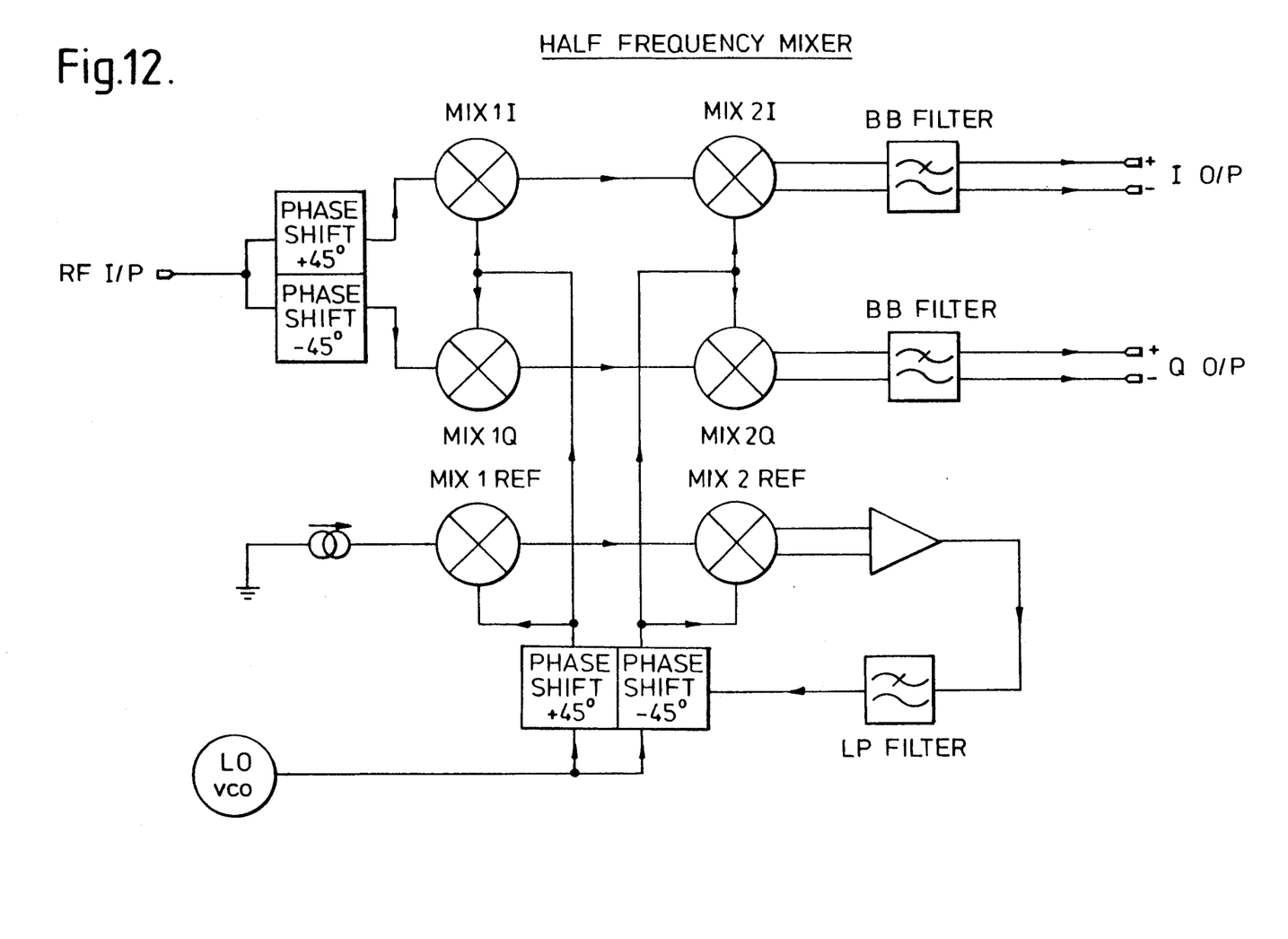

The phase shift circuits may be constructed in a number of known ways, two of which are shown in FIG. 10. As previously mentioned the LO drives may also be generated by the use of a frequency divider network.

Where low I and Q output frequencies are not required, the differential mixer outputs may be monitored and DC balance maintained by a system as shown in diagram 11. Here any common DC offset in the mixer outputs are corrected by an error signal being feed back to control the phase shift circuit. Phase correction may be achieved by trimming R and or C components by the use of FETs or varicap diodes respectively. This could have the advantage of enabling DC coupling of the outputs to be used and reduce the need for setting up of the LO drives.

The advantage offered by this invention is to provide a direct conversion system which reduces the problems of local oscillator radiation being picked up by the front end and hence being converted down to unwanted baseband signals. It may also have a significant advantage of reducing the pulling of the half frequency VCO when transmitting in transceiver systems. The technique is ideally suited for systems that I and Q demodulation schemes such as in GSM DECT CT2 PCN etc.

The present invention is intended for operation up to 1 GHz. This is of particular use in the cordless telephone market and may be extended to higher frequency applications in the future.

I claim:

1. A mixer system for a direct conversion receiver comprising an RF input path for received signals modulated on a radio frequency carrier, means to divide said received signals into I and Q paths for demodulating from said received signals I and Q signals in phase quadrature, first and second serially coupled mixer means in said I path, third and fourth serially coupled mixer means in said Q path, local oscillator means to generate local oscillator signals at a frequency of one half of the frequency of said carrier, means to apply said local oscillator signals in phase quadrature to said first and second mixer means, means to apply said local oscillator signals in phase quadrature to said third and fourth mixer means, and means to derive said I and Q signals from outputs of said second and fourth mixer means respectively.

2. A mixer system in accordance with claim 1 wherein said means to divide said received signals into said I and Q paths is arranged to apply said received signals to said I and Q paths in phase quadrature, and said local oscillator signals are arranged to be applied to said first and third mixer means in phase quadrature.

3. A mixer system in accordance with claim 1 wherein there are provided controllable phase shift means to apply said local oscillator signals in phase quadrature to said first and second mixer means and in phase quadrature to said third and fourth mixer means, and feedback means responsive to said demodulated I and Q signals to control said phase shift means.

4. A mixer system for a direct conversion receiver comprising an RF input path for received signals modulated on a radio frequency carrier, means to divide said received signals into I and Q paths for demodulating from said received signals I and Q signals in phase quadrature, first and second serially coupled mixer means in said I path, third and fourth serially coupled mixer means in said Q path, local oscillator means to generate local oscillator signals at a frequency of one half of the frequency of said carrier, means to apply said local oscillator signals in phase quadrature to said first and second mixer means, means to apply said local oscillator signals in phase quadrature to said third and fourth mixer means, said local oscillator signals being applied to said first, second, third and fourth mixer means with relative phase shifts of $+67.5$, $-22.5$, $+22.5$ and $-67.5$ degrees respectively, and means to derive said I and Q signals from outputs of said second and fourth mixer means respectively.

5. A mixer system for a direct conversion receiver comprising an RF input path for received signals modulated on a radio frequency carrier, means to divide said received signals into I and Q paths for demodulating from said received signals I and Q signals in phase quadrature, first and second serially coupled mixer means in said I path, third and fourth serially coupled mixer means in said Q path, local oscillator means to generate local oscillator signals at a frequency of one half of the frequency of said carrier, means to apply said local oscillator signals in phase quadrature to said first and second mixer means, means to apply said local oscillator signals in phase quadrature to said third and fourth mixer means, and means to derive said I and Q signals from outputs of said second and fourth mixer means respectively, said I path including a first transistor having a main current path and a control electrode, said first mixer means including a second transistor having a main current path and a control electrode, and said second mixer including a third transistor having a main current path and a control electrode, and there being provided means connecting the main current paths of said first, second and third transistors in series, means to apply said received signals to the control electrode of said first transistor and means to apply the respective local oscillator signals for said first and second mixer means to the control electrodes of said second and third transistors respectively.

6. A mixer system in accordance with claim 5 wherein said first mixer comprises said second transistor and a fourth transistor having a main current path and a control electrode, said second and fourth transistors being connected as a differential pair with the main current paths of said second and fourth transistors each connected in series with the main current paths of said first and second transistors.

7. A mixer system in accordance with claim 6 wherein said second mixer comprises said third transistor and a fifth transistor having a main current path and a control electrode, said third and fifth transistors being connected as a differential pair with the main current paths of said third and fifth transistors each connected in series with the main current paths of said first and second transistors.

* * * * *